US010283658B2

(12) United States Patent
Yang

(10) Patent No.: US 10,283,658 B2
(45) Date of Patent: May 7, 2019

(54) INTERBAND CASCADE DEVICES

(71) Applicant: The Board of Regents of the University of Oklahoma, Norman, OK (US)

(72) Inventor: Rui Q. Yang, Norman, OK (US)

(73) Assignee: The Board of Regents of the University of Oklahoma, Norman, OK (US)

(*) Notice: Subject to any disclaimer, the term of this patent is extended or adjusted under 35 U.S.C. 154(b) by 0 days.

(21) Appl. No.: 14/853,588

(22) Filed: Sep. 14, 2015

(65) Prior Publication Data

US 2016/0005895 A1    Jan. 7, 2016

Related U.S. Application Data

(63) Continuation-in-part of application No. 13/024,203, filed on Feb. 9, 2011, now Pat. No. 9,166,084.

(51) Int. Cl.
*B82Y 20/00* (2011.01)
*H02S 10/30* (2014.01)
*H01L 31/0304* (2006.01)
*H01L 31/0352* (2006.01)
*H01L 31/0725* (2012.01)
*H01L 31/0735* (2012.01)

(52) U.S. Cl.
CPC .. *H01L 31/035236* (2013.01); *H01L 31/0304* (2013.01); *H01L 31/0725* (2013.01); *H01L 31/0735* (2013.01); *H02S 10/30* (2014.12); *B82Y 20/00* (2013.01); *Y02E 10/544* (2013.01)

(58) Field of Classification Search
CPC ....... H01L 31/035236; H01L 31/06875; H01L 31/0735; H01L 31/035263; H01L 31/075; H01L 31/076; H02S 10/30
USPC .................................................. 136/243–265
See application file for complete search history.

(56) References Cited

U.S. PATENT DOCUMENTS

| 4,718,947 A | * | 1/1988 | Arya ..................... H01L 31/075 |
| | | | 136/258 |
| 5,496,415 A | * | 3/1996 | Barnham ........ H01L 31/035236 |
| | | | 136/255 |
| 5,588,015 A | | 12/1996 | Yang |

(Continued)

OTHER PUBLICATIONS

Choi, et al., "High-performance GaInAsSb Thermophotovoltaic Devices With an AlGaAsSb Window", Applied Physics Letters, vol. 71, No. 26, Dec. 29, 1997, pp. 3758-3760.

(Continued)

*Primary Examiner* — Andrew J Golden
(74) *Attorney, Agent, or Firm* — Conley Rose, P.C.; Grant Rodolph; Jonathan K. Polk

(57) ABSTRACT

Photovoltaic (PV) and photodetector (PD) devices, comprising a plurality of interband cascade (IC) stages, wherein the IC stages comprise an absorption region with a type-I superlattice and/or a bulk semiconductor material having a band gap, the absorption region configured to absorb photons, an intraband transport region configured to act as a hole barrier, and an interband tunneling region configured to act as an electron barrier, wherein the absorption region, the intraband transport region, and the interband tunneling region are positioned such that electrons will flow from the absorption region to the intraband transport region to the interband tunneling region.

24 Claims, 7 Drawing Sheets

(56) References Cited

U.S. PATENT DOCUMENTS

| | | |
|---|---|---|
| 5,799,026 A | 8/1998 | Meyer et al. |
| 6,404,791 B1 | 6/2002 | Yang |
| 6,743,974 B2 | 6/2004 | Wada et al. |
| 7,202,411 B1 | 4/2007 | Wernsman |
| 7,282,777 B1 | 10/2007 | Chuang et al. |
| 9,166,084 B2 | 10/2015 | Yang et al. |
| 2005/0022860 A1 | 2/2005 | Toh |
| 2005/0155641 A1 | 7/2005 | Fafard |
| 2005/0247339 A1 | 11/2005 | Barnham et al. |
| 2009/0078310 A1* | 3/2009 | Stan .................. H01L 31/03529 136/255 |
| 2012/0125392 A1* | 5/2012 | Woo .................... H01L 31/0304 136/244 |

OTHER PUBLICATIONS

Green, et al., "Solar Cell Efficiency Tables (Version 34)," Progress in Photovoltaics: Research and Applications, Jun. 26, 2009, vol. 17, pp. 320-326.

Harder, et al., "Theoretical Limits of Thermophotovoltaic Solar Energy Conversion," Semiconductor Science and Technology, vol. 18, 2003, pp. S151-S157.

Henry, "Limiting Efficiencies of Ideal Single and Multiple Energy Gap Terrestrial Solar Cells," Journal of Applied Physics, vol. 51, No. 8, Aug. 1980, pp. 4494-4500.

King, et al., "40% Efficient Metamorphic GaInP/GaInAs/Ge Multifunction Solar Cells," Applied Physics Letters, vol. 90, 2007, pp. 183516-1-183516-3.

Kurtz, et al., "A Comparison of Theoretical Efficiencies of Multi-junction Concentrator Solar Cells," Progress in Photovoltaics: Research and Applications, vol. 16, Mar. 31, 2008, pp. 537-546.

Razeghi, et al., "Recent Advances in LWIR Type-II InAs/GaSb Superlattice Photodetectors and Focal Plane Arrays at the Center for Quantum Devices, Improvement in material quality and structural for Long Wave Infrared devices have increased their capability for use in imaging application," Proceedings of the IEEE, vol. 97, No. 6, Jun. 2009, pp. 1056-1066.

Tian, et al., "Plasmon-Waveguide Interband Cascade Lasers Near 7.5 μm," IEEE Photonics Technology Letters, vol. 21, No. 21, Nov. 1, 2009, pp. 1588-1590.

Yang, "Novel Concepts and Structures for Infrared Lasers," Chapter 2, "Long Wavelength Infrared Emitters Based on Quantum Wells and Superlattices," edited by Manfred Helm, Gordon & Breach Pub., Singapore, 2000, pp. 13-64.

Yang, et al., "Distributed Feedback Mid-IR Interband Cascade Lasers at Thermoelectric Cooler Temperatures," IEEE Journal of Selected Topics in Quantum Electronics, vol. 13, No. 5, Sep./Oct. 2007, pp. 1074-1078.

Yang, et al., "Interband Cascade Infrared Photodetectors With Superlattice Absorbers," Journal of Applied Physics, vol. 107, 2010, pp. 054514-1-054514-6.

Yang, et al., "Interband Cascade Photovoltaic Devices," Applied Physics Letters, vol. 96, No. 6, 2010, pp. 063504-1-063504-3.

Li, J., et al., "Interband cascade detectors with room temperature photovoltaic operation," Applied Physics Letters, vol. 86, 2005, 4 pages.

Notice of Allowance dated Jun. 16, 2015, 11 pages, U.S. Appl. No. 13/024,203, filed Feb. 9, 2011.

Office Action dated Feb. 11, 2014, 17 pages, U.S. Appl. No. 13/024,203, filed Feb. 9, 2011.

Office Action dated Mar. 21, 2013, 13 pages, U.S. Appl. No. 13/024,203, filed Feb. 9, 2011.

Office Action dated Aug. 14, 2013, 16 pages, U.S. Appl. No. 13/024,203, filed Feb. 9, 2011.

Courel, et al., "GaAs/GaInNAs Quantum Well and Superlattice Solar Cell," American Institute of Physics, App. Phys. Lett. 100, 073508, Feb. 17, 2012, 5 pages.

Shockley, William, et al.; "Detailed Balance Limit of Efficiency of p-n Junction Solar Cells"; Journal of Applied Physics; vol. 32; No. 3; Mar. 1961; 11 pages.

QuantaSol; "QuantaSol Unveils 28.3% Efficient Single-Junction Solar Cell"; Business Wire; http://www.businesswire.com/news/home/20090630005526/en/QuantaSol-unveils-28.3-efficient-single-junction-solar-cell; Jun. 30, 2009; 2 pages.

* cited by examiner

INTERBAND CASCADE DEVICES

CROSS-REFERENCE TO RELATED APPLICATIONS

This application is a continuation-in-part of U.S. patent application Ser. No. 13/024,203, filed Feb. 9, 2011, the entirety of which is hereby expressly incorporated herein by reference.

STATEMENT REGARDING FEDERALLY SPONSORED RESEARCH OR DEVELOPMENT

This invention was made with government support under Contract Number ECCS-1202318 awarded by the National Science Foundation, Contract Number FA9550-09-1-0288 awarded by the Air Force Office of Scientific Research, and Contract Number DE-AC04-94AL85000 awarded by the U. S. Department of Energy's National Nuclear Security Administration. The government has certain rights in the invention.

REFERENCE TO A MICROFICHE APPENDIX

Not applicable.

BACKGROUND

Most semiconductor functional devices are based on conventional p-n junctions. For example, conventional photodetectors, which are used for detection of light in a wide spectrum range from visible to far-infrared, use n-type and p-type semiconductors (with various band gaps) to form p-n junctions. Other examples are p-n junction photovoltaic (PV) devices, such as solar cells, which are important for the conversion of solar and thermal energy into electricity. For a single junction cell with one band gap (at a concentration of one sun), the maximum theoretical conversion efficiency is about 30%. To achieve high conversion efficiency, multiple junction cells with different band gap materials can be used. For example, triple junction solar cells (containing materials with three different energy gaps) have a theoretical conversion efficiency of 56% at 1,000 suns, and a current state-of-the-art efficiency of about 32% at 1 sun and approximately 41% at 240 suns. One of the obstacles that affect practical PV device performance is a limitation in the availability of semiconductor materials with a range of band gaps that adequately span the solar (or heat) spectrum and that can be effectively integrated within a single device or system, as well as current matching between multiple junctions. Other obstacles in these conventional p-n junction semiconductor devices are related to a finite carrier diffusion length and a large resistance of Esaki tunnel junction that is used to connect different p-n junctions. Therefore, it is an objective of the present disclosure to provide innovative interband cascade architectures to overcome the limitations in conventional semiconductor p-n junction devices.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is an interband cascade (IC) architecture for photovoltaic (PV) and photodetector (PD) devices. Examples of PV devices that can benefit from the disclosed IC architecture include, but are not limited to, solar cells, solar panels, and thermophotovoltaic devices. Examples of PD devices that can benefit from the disclosed IC architecture include, but are not limited to, infrared photodetectors and devices using such detectors. In at least some embodiments, the disclosed IC PV architecture comprises absorption and transport regions with characteristics that are favorable for achieving high open-circuit voltage, and thus improving conversion efficiency over conventional PV devices. Preliminary experiments carried out using IC infrared photodetectors and lasers, showed open-circuit voltages that exceed the single band gap voltage from these devices under infrared light illumination. Although the observed open-circuit voltage was based on multiple IC PV architecture stages operating in series, the disclosed embodiments are not intended to limit other arrangements for the IC PV architecture stages.

Figure 1:
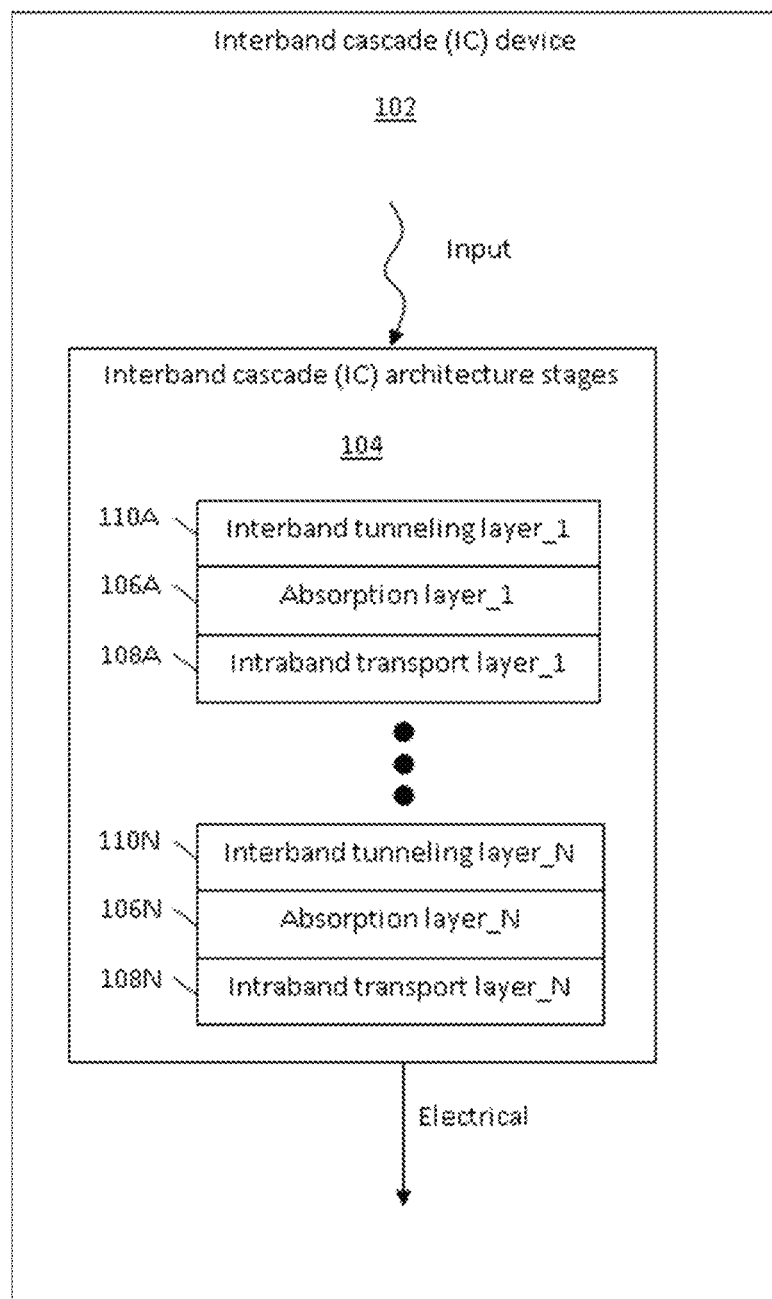
FIG. 1 is a schematic of an interband cascade (IC) device constructed in accordance with the presently disclosed inventive concepts.

FIG. 1 shows an embodiment of an IC device 102 (PV or PD) constructed in accordance with the presently disclosed inventive concepts. As shown, the IC device 102 comprises a plurality of IC architecture stages 104, where each stage comprises an interband tunneling region (i.e., each of layers 110A-110N corresponds to an interband transport tunneling region), an absorption region (i.e., each of layers 106A-106N corresponds to an absorption region) that operates to absorb photons, and an intraband transport region (i.e., each of layers 108A-108N corresponds to an intraband transport region).

Each absorption region 106A-106N may correspond to the same band gap or to different band gaps. Absorption regions with the same band gap could be implemented, for example, to enable high intensity photon beams of a particular energy level to be absorbed. Meanwhile, absorption regions 106A-106N with different band gaps could be implemented to enable photons with different energy levels to be absorbed. As an example, if the IC device 102 corresponds to a PV solar cell or solar panel, the absorption regions 106A-106N may provide a variety of band gaps to account for photons with different energy levels being emitted from the sun. Alternatively, if the IC device 102 corresponds to a thermophotovoltaic device, the absorption regions 106A-106N may provide a plurality of similar band gaps to account for photons with the same energy levels being emitted from a local source of light/heat.

In at least some embodiments, the layers forming IC architecture stages 104 (N stages are shown) are stacked in series. In alternative embodiments, the IC architecture stages 104 may be arranged into multiple side-by-side stacks that are electrically connected in series.

Figure 2A:
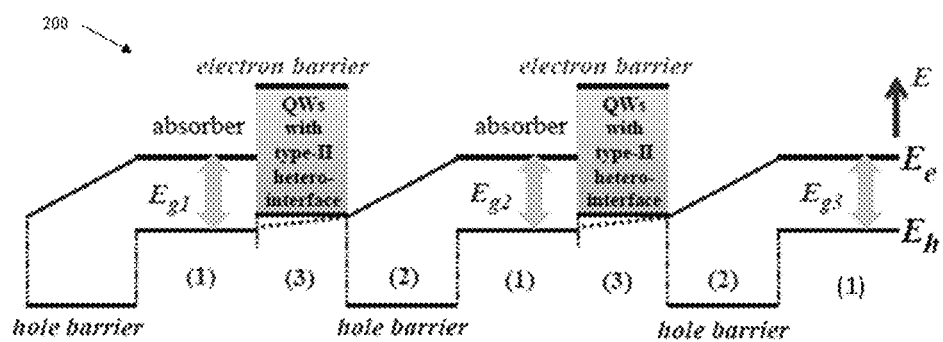
FIG. 2A is a schematic of an embodiment of an interband cascade photovoltaic (IC PV) architecture for an IC PV device constructed in accordance with the presently disclosed inventive concepts.

FIG. 2A shows of an embodiment of an IC device comprising an IC device architecture 200 for photovoltaic devices and photodetectors constructed in accordance with the presently disclosed inventive concepts. The disclosed IC device architecture 200 may comprise multiple cascade stages where each stage is divided into three regions according to three processes: (1) photon absorption, (2) intraband carrier transport, and (3) interband tunneling transport, as shown in FIG. 2A. In at least some embodiments, the absorption regions (1) for IC device architecture 200 comprises a type-I quantum well (QW) or type-I superlattice (SL) structure connected by asymmetric intraband transport regions (2) and interband tunneling regions (3) with a type-II heterointerface for facilitating interband tunneling. Regions (2) and (3) also act as hole and electron barriers, respectively. The effective band gap in each absorption region (1) (corresponding to band gap energies $E_{g1}$ to $E_{g3}$) is determined by the continuant semiconductor material and layer thicknesses in the SL and can be tailored to cover certain spectral range. The band gap and thickness of the absorber in a cascade stage can be designed to be either the same or different from the adjacent stages, depending on the photon distribution of the radiation source. For the different band gaps, photon absorption may cause electrons to be excited from a valence state $E_h$ to a conduction state $E_e$.

Stages with the same and different effective band gaps can be stacked in a way analogous to the different p-n junctions in a multiple junction cell to more efficiently make use of the source spectrum. As discussed below, it is possible to stack many such stages with different band gaps to efficiently divide up a source spectrum. The transport regions (2) are constructed, for example, with compositionally-graded semiconductor alloys or with digitally-graded multiple QWs to form a tilted-band profile. This construction enables the conduction band of one end of the profile to be near the conduction band of the adjoining absorption region, while the conduction band at the other end of the profile is near the valence band of the electron barrier (3) and the absorption region adjoining it in the neighboring stage. The transport region (2) plays a role similar to the depletion region in a conventional p-n junction to direct current in one direction. However, only the electrons move through the intraband transport region because holes are confined in regions (1) and (3).

Figure 2B:
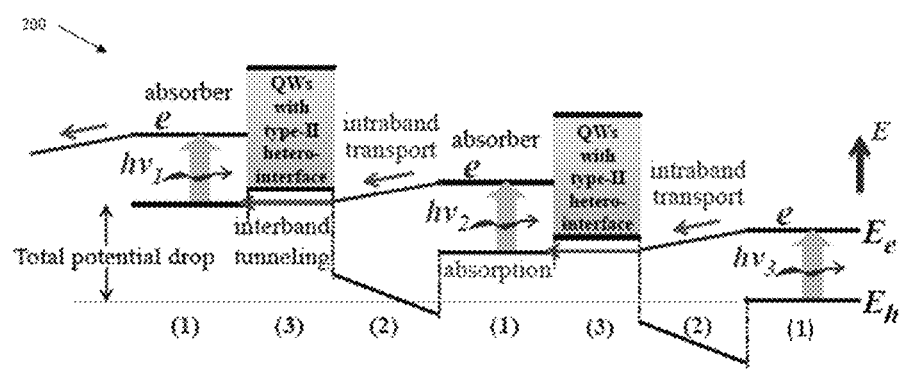
FIG. 2B is a schematic of electron and hole movement in the IC PV architecture of FIG. 2A during illumination.

When light is incident upon the IC device architecture 200, photogeneration of electrons and holes results in a separation of electron and hole quasi-Fermi levels. FIG. 2B shows the IC device architecture 200 of FIG. 2A during illumination. As shown in FIG. 2B, electrons move to the left (with holes moving to the right) due to the asymmetry of the transport region. At steady state, an internal electric field will be built up to balance this movement of charge carriers, resulting in a sequential potential drop in each cascade stage, shown in FIG. 2B. These potential drops in every stage add and contribute to a total forward bias voltage similar to that in a multiple p-n junction cell. However, in contrast to the p-n junction structure, where heavily-doped p- and n-regions are required, doping is not necessary in the IC device architecture 200 structures, eliminating the detrimental effects of high carrier concentrations such as free-carrier absorption and reduced minority-carrier diffusion length. This IC device architecture 200 is particularly desirable for high-intensity illumination with a concentrator, where the high-intensity radiation may not be fully absorbed in the single p-n junction of a conventional cell whose thickness is limited to the photogenerated carrier diffusion length. For a PV device with the IC device architecture 200, multiple stages with the same energy gap can be used to absorb all the photons in a particular portion of the source spectrum while increasing the open-circuit voltage, where the thickness of each stage is shorter than the diffusion length and is chosen so that each stage generates the same photocurrent (the stages are current matched). Losses associated with high-current operation are also minimized by increasing the open circuit voltage. Further, dark current may be reduced in an IC structure where radiation and absorption (even at the same photon energy) is partitioned by multiple cascade stages, and the thickness of each stage is significantly shorter than the diffusion length. And finally, the interband tunneling regions (3) with type-II heterostructures will be less resistive than Esaki tunnel p-n junctions used in conventional tandem cells, and the high-voltage, low-current characteristic of the multi-stage arrangement will serve to minimize the losses associated with residual parasitic device resistances.

Figure 2C:
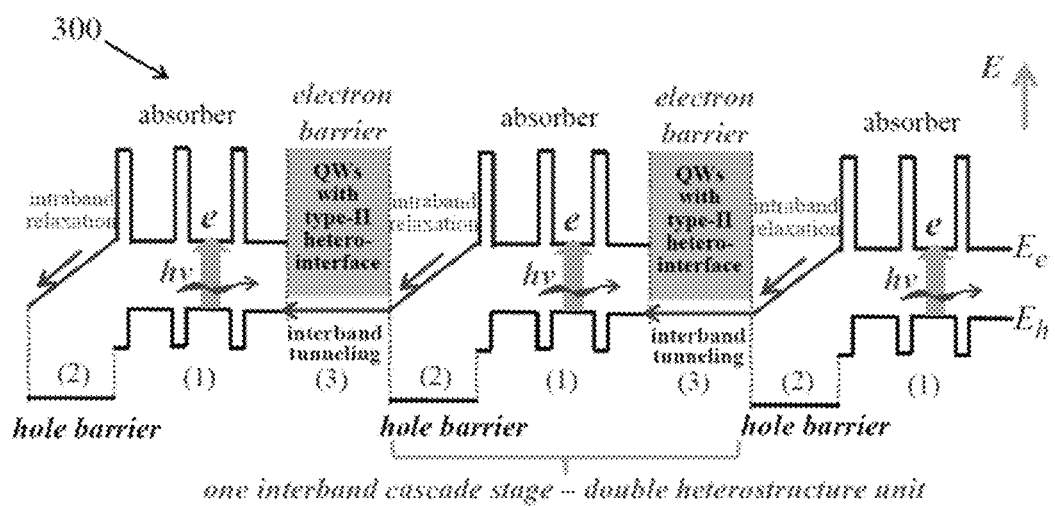
FIG. 2C is a schematic of an embodiment of an interband cascade photodetector (IC PD) architecture for an IC PD device constructed in accordance with the presently disclosed inventive concepts, and showing electron and hole movement during illumination.

FIG. 2C shows an embodiment of an IC device comprising an IC photodetector architecture 300 for photodetector devices constructed in accordance with the presently disclosed inventive concepts. Unlike IC devices having absorption regions that are made of type-II superlattices (SLs) where electrons and holes are mainly distributed in different layers, the absorption regions (1) in FIG. 2C is made of multiple type-I QWs or type-I SLs where electrons and holes are mainly distributed in the same layers. Hence, light absorption is enhanced in type-I SL absorbers and thinner absorbers can be used to absorb the same amount of light so that carriers can travel in a shorter distance, resulting in the higher collection efficiency. Alternatively, the absorption region (1) can be constructed of bulk semiconductor materials where electrons and holes are distributed in the same bulk material layer. In this way, the number of interfaces would be reduced, resulting in more smooth carrier transport. Alternatively, the absorption region (1) can be constructed of both type-I SL and bulk semiconductor materials.

Figure 3:
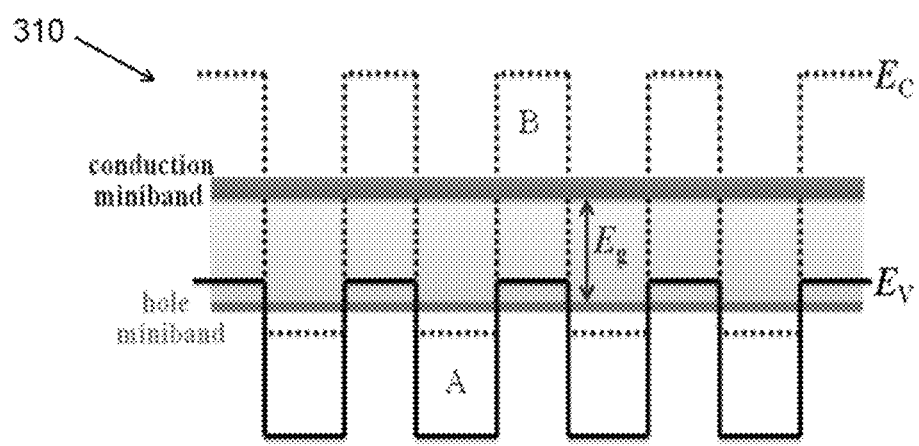
FIG. 3 shows an absorption region structure based on a type-II Superlattice (SL) for an IC device architecture.

FIG. 3 shows an absorption region structure 310 for an IC architecture (e.g., corresponds to absorption regions 106A-106N of IC device 102 in FIG. 1 or absorption regions (1) in FIGS. 2A-2B). In at least some embodiments, the absorption region structure 310 is constructed of semiconductor materials A and B that have a type-II band-edge alignment (preferably of the broken-gap variety, i.e., with the conduction-band edge, $E_C$, of material A lower in energy than the valence-band edge, $E_V$, of material B) to form QW or SL structures, as shown in FIG. 3. Because of quantum size effects, the locations of energy minibands in the type-II SL are mainly determined by the thicknesses of the layers of materials A and B. As such, the band gap $E_g$ (the energy separation between the first conduction miniband and the first hole miniband) in the SL is not determined solely by the band gaps of the constituent materials A and B, but can be tailored to cover a wide spectral range with great flexibility by adjusting layer thicknesses. Therefore, a device comprising type-II QW or type-II SL absorption regions can be quantum engineered to optimize the absorption of photons over the entire spectrum of a radiation source. The use of the type-II SL absorption regions versus conventional p-n junction cells have several advantages. For example, each of the absorption regions is made from the same constituent materials, which makes it: 1) simpler to grow by molecular beam epitaxy (MBE); 2) simpler to adjust the absorption wavelengths to optimize the slicing of the incident photon flux vs. energy spectrum; and 3) simpler to add more absorption regions. However, because electrons and holes are mainly distributed in different layers in type-II SLs, light absorption in a type-II SL has been found to be relatively weak in comparison to an absorption region comprising a type-I SL or a bulk semiconductor material layer with the same band gap. Additionally, many interfaces in type-II superlattices present challenges for material growth and complicate carrier transport. To circumvent these issues, type-I SL and/or direct band gap semiconductor bulk materials are used as absorption layers in the IC devices of the present disclosure.

In other embodiments of IC PV and IC PD devices of the presently disclosed inventive concepts, the absorption region 310 of FIG. 3 is constructed of a Type-I superlattice or a direct band gap semiconductor bulk material with a band gap (e.g., see FIG. 2C).

Figure 4:
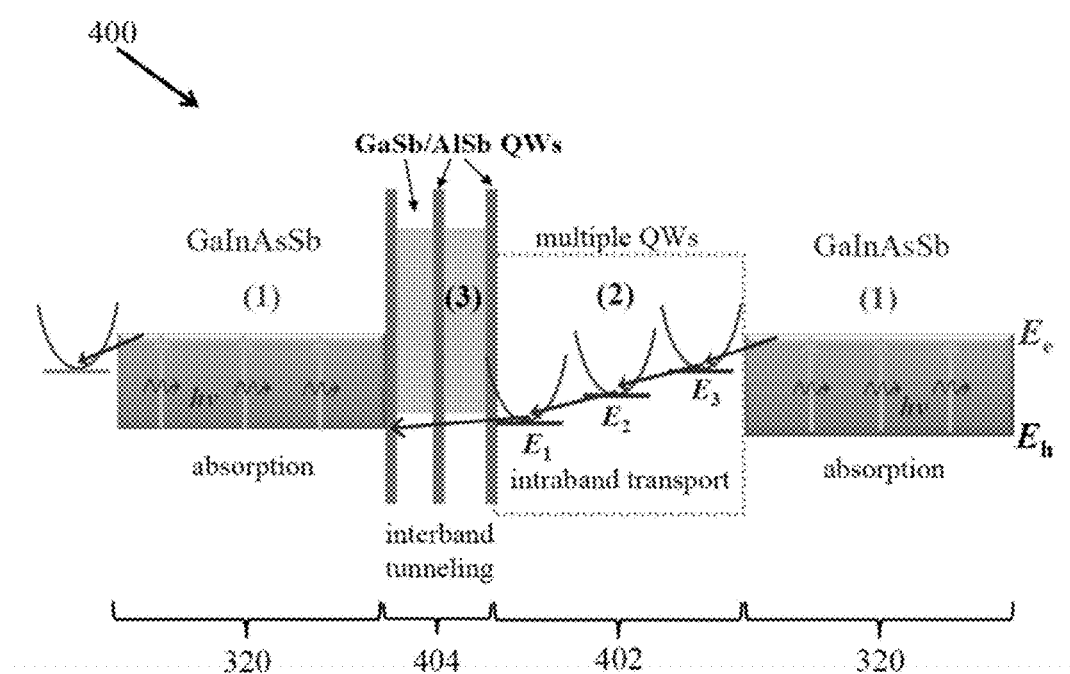
FIG. 4 shows operations of an IC PV architecture with the absorption region made of bulk semiconductor material in accordance with the presently disclosed inventive concepts.

FIG. 4 shows operations of an IC device architecture 400 with an absorption region 320 made of a bulk semiconductor material (for example gallium indium arsenide antimonide (GaInAsSb)), an intraband transport region 402, and an interband tunneling region 404, constructed in accordance with at least one embodiment of the present disclosure. In at least some embodiments, IC device architecture 400 can be constructed with readily available semiconductor materials. In certain embodiments, the absorption region 320 may comprise one or more semiconductor layers to form type-I QWs or SLs consisting of or comprising Indium-Arsenic (InAs), Indium-Arsenic-Antimony (InAsSb), Indium-Gallium-Arsenic (InGaAs), Indium-Gallium-Arsenic-Antimony (InGaAsSb), Gallium-Antimony (GaSb), Gallium-Indium-Antimony (GaInSb), Aluminum-Gallium-Antimony (AlGaSb), Aluminum-Gallium-Indium-Antimony (AlGaInSb), Gallium-Arsenic (GaAs), Aluminum-Antimony (AlSb), Aluminum-Arsenic (AlAs), Aluminum-Indium-Antimony (AlInSb), Aluminum-Antimony-Arsenic (AlSbAs), Aluminum-Gallium-Antimony-Arsenic (AlGaSbAs), Aluminum-Indium-Gallium-Antimony-Arsenic (AlInGaSbAs), or combinations thereof. Similarly, the intraband transport region may comprise one or more semiconductor layers consisting of or comprising InAs, InAsSb, InGaAs, InGaAsSb, GaSb, GaInSb, AlGaSb, AlGaInSb, GaAs, AlSb, AlAs, AlInSb, AlSbAs, AlGaSbAs, AlInGaSbAs, or combinations thereof. Additionally, the interband tunneling region may comprise one or more semiconductor layers consisting of or comprising InGaAs, InGaAsSb, GaSb, GaInSb, AlGaSb, AlGaInSb, GaAs, AlSb, AlAs, AlInSb, AlSbAs, AlGaSbAs, AlInGaSbAs, or combinations thereof.

For example, the IC device architecture 400 may be constructed from materials selected from the InAs/GaSb/AlSb group with the lattice constant near 6.1 Angstroms (Å). In the IC device architecture 400, the intraband transport region 402 may comprise multiple QWs (for example InAs/AlInSb QWs) with energy levels $E_1$, $E_2$, $E_3$, etc., (only three levels are shown to simplify the diagram) to form an energy ladder for directing and facilitating electron transport to the left. The transport of electrons to the right is greatly suppressed because the electron level $E_e$ is located in the band gap of the interband tunneling region (electron barrier) 404, which comprises, for example, GaSb and AlSb layers. This band gap blocking and overall asymmetric band profile arrangement will minimize the dark current to the right and benefit photovoltaic operations. When the IC device architecture 400 is illuminated, electrons move through the three operations shown in FIG. 4. These operations are: (1) excitation of electrons by photons to the conduction state $E_e$; (2) intraband transport via conduction band $E_e$ and sequential energy levels ($E_1$, $E_2$, . . . ) to the left; and (3) interband tunneling facilitated by the type-II band edge alignment. The energy levels ($E_1$, $E_2$, . . . ) in the intraband transport region 402 become nearly aligned to form an effective intraband transport channel for electrons when illuminated with intensive light for PV operation. This is similar to an IC laser structure under a forward bias, but in the IC device architecture 400 the current is reversed with net photon absorption instead of photon emission.

In at least some embodiments of the IC device architecture 400, the materials for the absorption regions 320 and intraband transport region 402 are type-II aligned III-V materials near lattice parameter 6.1 Å—GaInAsSb in absorption region (1) and InAs/GaSb/AlSb with some layers of AlGaInSb and Aluminum-Arsenic-Antimony (AlAsSb) in regions (2) and (3). In such case, InAs and GaSb substrates are appropriate, but GaSb, which has a lattice constant nearly half-way between InAs (0.62% tensile strain) and AlSb (0.65% compressive strain), is preferable (though not required), so that defect-induced generation/recombination will be negligible. These materials have been used to make high-performance light-emitting diodes, lasers, and photodetectors over a wide portion of the infrared (IR) spectrum (2-15 micrometers (μm)). Similarly, Antimony (Sb)-based IC structures have been used for efficient mid-infrared (IR) lasers from 2.7 to 11 μm. Hence, IC device architecture 400 can be expected to exhibit high performance at these wavelengths. For IC device architecture 400, operation at wavelengths shorter than 2 μm, the electron energy level ($E_e$ in FIG. 4) will need to be pushed near or above the conduction band edge of GaSb to obtain the required larger energy gap. As a consequence, the role of the GaSb layers to block electron transport (to the right in FIG. 4) will be diminished. To alleviate this problem, multiple QW layers may be used in the intraband transport region 402, such that there is a mini-gap (acting as a Bragg reflector for electron waves) aligned with $E_e$ to effectively prevent electrons from direct escape to the right. Also, adequate doping density and distribution can be introduced in the absorption region 320 to direct and enhance electron transport in the desired direction (here, to the left).

An IC device architecture of this type can be effectively used as the long-wavelength component of a solar cell, or as the sole conversion element in a thermophotovoltaic (TPV) system with a source temperature of 2,000 degrees Celsius (° C.) or less. A TPV system could use concentrated solar radiation to heat an intermediate emitter to a temperature significantly lower than the sun's temperature with emission spectrum that is ideally matched to the PV device. Such an IC device architecture may achieve an overall conversion efficiency above 50% based on a theoretical limit of 85% for a TPV device.

In alternative embodiments of IC device architecture 400, the interband tunneling region 404 may have a type-II heterointerface with the intraband transport region 402 of an adjacent IC PV stage. Furthermore, in alternative embodiments, at least one IC PV stage is combined with one or more conventional p-n junctions with interband cascade stages. Furthermore, in alternative embodiments, the IC device architecture 400 may be grown on a substrate selected from the group of materials consisting of Ge, Si, GaAs, InP, ZnS, SiC, ZnO, and sapphire.

Figure 5:
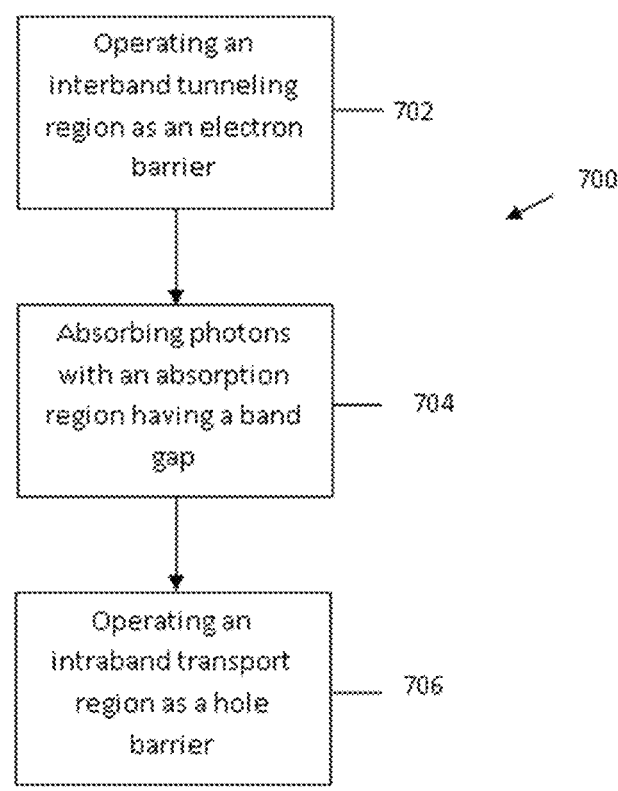
FIG. 5 shows a method for IC PV device operations in accordance with the presently disclosed inventive concepts.

FIG. 5 shows a method 700 for IC PV device operations in accordance with at least one non-limiting embodiment of the disclosure. As shown, the method 700 comprises operating an interband tunneling region as an electron barrier (702). The method also comprises absorbing photons with an absorption region having a band gap (704). The method 700 also comprises operating an intraband transport region as a hole barrier (706).

In at least some embodiments, the method 700 may comprise additional steps or fewer steps. As an example, the method 700 may additionally comprise performing the absorbing step and the operating steps for each of a plurality of IC device stages. Further, the method 700 may additionally comprise absorbing photons with different absorption regions configured to absorb photons with different energy levels. Further, the method 700 may additionally comprise absorbing photons with different absorption regions configured to absorb photons with substantially similar energy levels. Further, the method 700 may additionally comprise stacking each of a plurality of IC device stages in series.

In at least some embodiments, the IC devices with the disclosed IC architecture comprise type-II heterostructures to facilitate interband tunneling between serially connected light absorption units that have different band gaps. As such, transport is smooth without heavy-doped p-n junctions, and the conversion efficiency can be higher than single-unit photovoltaic cells because multiple absorption units can convert optical energy from various photons (with different wavelength) into electrical energy. Also, the disclosed IC architecture explores a new transport mechanism. Instead of relying on conventional p-n junctions, photon-excited carriers can form the current via intersubband relaxations between neighboring quantum wells, which may improve overall efficiency. These features can be incorporated into an IC architecture for a PV or a PD device independently or in combination, depending on applications and specific requirements.

In at least one embodiment, the presently disclosed inventive concepts include an interband cascade (IC) device, comprising a plurality of IC stages, wherein at least one of the IC stages comprises (1) a conduction band and a valence band, (2) an absorption region comprising at least one of a Type-I superlattice and a direct band gap semiconductor bulk material with a first band gap, the absorption region configured to absorb photons, (3) an intraband transport region configured to act as a hole barrier and coupled to the absorption region, wherein the intraband transport region has a second band gap that is greater than the first band gap, and (4) an interband tunneling region configured to act as an electron barrier and coupled to the absorption region, wherein the interband tunneling region has a third band gap that is greater than the first band gap, and wherein the interband tunneling region is coupled to an adjacent intraband transport region of an adjacent IC stage via a type II heterointerface, and wherein the absorption region is positioned between the intraband transport region and the interband tunneling region, wherein the interband tunneling region is configured such that: electrons in the conduction band flow from the absorption region to the intraband transport region in a first direction away from the interband tunneling region, the interband tunneling region suppresses the electrons from flowing in a second direction opposite from the first direction, and holes in the valence band flow from the absorption region toward the interband tunneling region; and wherein the plurality of IC stages is configured so that the electrons flow from the absorption region to the intraband transport region then flow into an adjacent valence band of the adjacent IC stage. The IC device may be a photovoltaic (PV) device configured to operate at a forward bias voltage with net photon absorption for generating an electric power output. The IC device may be a solar panel. The IC device may be a thermophotovoltaic device. The IC device may be an infrared photodetector (ICIP) device configured to operate at zero bias or a reverse bias voltage with electric signal output. Absorption regions corresponding to different IC stages of the plurality of IC stages of the IC device may be configured to absorb photons with different energies. Absorption regions corresponding to different IC stages of the plurality of IC stages of the IC device may be configured to absorb photons with substantially similar energies. All of the plurality of IC stages may be configured to be current matched. The absorption region of the IC device may comprise one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs. The intraband transport region may comprise one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs. The interband tunneling region may comprise one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs. The plurality of IC stages may be grown on a substrate selected from the group consisting of InAs, InP, GaAs, GaSb, ZnS, SiC, ZnO, Si, Ge, and sapphire. At least one of the IC stages of the plurality of IC stages may be combined with one or more conventional p-n junctions with interband cascade stages. The absorption regions in the plurality of IC stages may have thicknesses that are shorter than a carrier diffusion length.

In at least one embodiment, the presently disclosed inventive concepts include an interband cascade (IC) device, comprising a plurality of IC stages, wherein at least one of the IC stages comprises: (1) a conduction band and a valence band, (2) an absorption region comprising a Type-I superlattice with a first band gap, the absorption region configured to absorb photons, (3) an intraband transport region configured to act as a hole barrier and coupled to the absorption region, wherein the intraband transport region has a second band gap that is greater than the first band gap, and (4) an interband tunneling region configured to act as an electron barrier and coupled to the absorption region, wherein the interband tunneling region has a third band gap that is greater than the first band gap, and wherein the interband tunneling region is coupled to an adjacent intraband transport region of an adjacent IC stage via a type II heterointerface, wherein the absorption region is positioned between the intraband transport region and the interband tunneling region; and wherein the interband tunneling region is configured such that: electrons in the conduction band flow from the absorption region to the intraband transport region in a first direction away from the interband tunneling region, the interband tunneling region suppresses the electrons from flowing in a second direction opposite the first direction, and holes in the valence band flow from the absorption region toward the interband tunneling region; and wherein the plurality of IC stages is configured so that the electrons flow from the absorption region to the intraband transport region then flow into an adjacent valence band of the adjacent IC stage.

In at least one embodiment, the presently disclosed inventive concepts include an interband cascade (IC) device, comprising a plurality of IC stages, wherein at least one of the IC stages comprises, (1) a conduction band and a valence band, (2) an absorption region comprising a direct band gap semiconductor bulk material with a first band gap, the absorption region configured to absorb photons, (3) an intraband transport region configured to act as a hole barrier and coupled to the absorption region, wherein the intraband transport region has a second band gap that is greater than the first band gap, (4) an interband tunneling region configured to act as an electron barrier and coupled to the absorption region, wherein the interband tunneling region has a third band gap that is greater than the first band gap, and wherein the interband tunneling region is coupled to an adjacent intraband transport region of an adjacent IC stage via a type II heterointerface, wherein the absorption region is positioned between the intraband transport region and the interband tunneling region; and wherein the interband tunneling region is configured such that electrons in the conduction band flow from the absorption region to the intraband transport region in a first direction away from the interband tunneling region, the interband tunneling region suppresses the electrons from flowing in a second direction opposite the first direction, and holes in the valence band flow from the absorption region toward the interband tunneling region, and wherein the plurality of IC stages is configured so that the electrons flow from the absorption region to the intraband transport region then flow into an adjacent valence band of the adjacent IC stage.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim.

As utilized in accordance with the present disclosure, the following terms, unless otherwise indicated, shall be understood to have the following meanings: The use of the word "a" or "an," or of the phrase "at least a first," when used in the claims and/or the specification may mean "one," "one or more," "at least one," or "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation or error for the device or the method being employed to determine a value. For example but not by way of limitation, when the term "about" is utilized, the designated value may vary by plus or minus fifteen percent, plus or minus twelve percent, or plus or minus eleven percent, or plus or minus ten percent, or plus or minus nine percent, or plus or minus eight percent, or plus or minus seven percent, or plus or minus six percent, or plus or minus five percent, or plus or minus four percent, or plus or minus three percent, or plus or minus two percent, or plus or minus one percent, or plus or minus one-half percent.

The use of the term "at least one" will be understood to include one as well as any quantity more than one, including but not limited to, 2, 3, 4, 5, 6, 7, 8, 9, 10, 11, 12, 13, 14, 15, 16, 17, 18, 19, 20, 21, 22, 23, 24, 25, 30, 35, 40, 45, 50, 55, 60, 65, 70, 75, 80, 85, 90, 95, 100, or more. The term "at least one" may extend up to 500 or 1000 or more, depending on the term to which it is attached; in addition, the quantities of 500/1000 are not to be considered limiting, as higher limits may also produce satisfactory results. In addition, the use of the term "at least one of X, Y and Z" will be understood to include X alone, Y alone, and Z alone, as well as any combination of X, Y and Z. The use of ordinal number terminology (i.e., "first", "second", "third", "fourth", etc.) is solely for the purpose of differentiating between two or more items and is not meant to imply any sequence or order or importance to one item over another or any order of addition, for example.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

As used herein, the term "substantially" means that the subsequently described event or circumstance completely occurs or that the subsequently described event or circumstance occurs to a great extent or degree. For example, the term "substantially" means that the subsequently described event or circumstance occurs at least 90% of the time, or at least 95% of the time, or at least 98% of the time. In general, the term "substantially" will be understood to allow for minor variations and/or deviations that do not result in a significant impact thereto.

Accordingly, the scope of protection is not limited by the description set out above but is defined by the claims that follow, that scope including all equivalents of the subject matter of the claims. Each and every claim is incorporated as further disclosure into the specification and the claims are embodiments of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure, including but not limited to U.S. Provisional Patent Application Ser. No. 61/298,598, filed Jan. 27, 2010, and U.S. patent application Ser. No. 13/024,203, filed Feb. 9, 2011.

While several embodiments of the presently disclosed inventive concepts have been provided herein, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An interband cascade (IC) device, comprising:
a plurality of IC stages, wherein at least one of the IC stages comprises:
  a conduction band and a valence band;
  an absorption region comprising at least one of a Type-I superlattice and a direct band gap semiconductor bulk material with a first band gap, the absorption region configured to absorb photons;
  an intraband transport region coupled to the absorption region and comprising a first heterostructure and a second band gap that is greater than the first band gap, wherein the first heterostructure comprises a first quantum well of a first composition and is configured to:
    have no barrier in the conduction band in order to allow electrons in the conduction band to flow from the absorption region to the intraband transport region; and
    have a first barrier in the valence band in order to suppress holes in the valence band from flowing from the absorption region to the intraband transport region; and
  an interband tunneling region coupled to the absorption region so that the absorption region is positioned between the intraband transport region and the interband tunneling region, wherein the interband tunneling region is coupled to an adjacent intraband transport region of an adjacent IC stage via a type II heterointerface, wherein the interband tunneling region comprises a second heterostructure and a third band gap that is greater than the first band gap, wherein the second heterostructure comprises a second quantum well of a second composition that is different from the first composition, and wherein the second heterostructure is configured to:
    have a second barrier in the conduction band in order to suppress the electrons in the conduction band from flowing from the absorption region to the interband tunneling region; and
    have no barrier in the valence band in order to allow the holes in the valence band to flow from the absorption region to the interband tunneling region,
  wherein the plurality of IC stages is configured so that the electrons flow from the conduction band of the absorption region to the intraband transport region then flow into an adjacent valence band of the adjacent IC stage.

2. The IC device of claim 1, wherein the IC device is a photovoltaic (PV) device configured to operate at a forward bias voltage with net photon absorption for generating an electric power output.

3. The IC device of claim 2, wherein the IC device is a solar panel.

4. The IC device of claim 2, wherein the IC device is a thermophotovoltaic device.

5. The IC device of claim 1, wherein the IC device is an infrared photodetector (ICIP) device configured to operate at zero bias or a reverse bias voltage with electric signal output.

6. The IC device of claim 1, wherein absorption regions corresponding to different IC stages of the plurality of IC stages are configured to absorb photons with different energies.

7. The IC device of claim 1, wherein absorption regions corresponding to different IC stages of the plurality of IC stages are configured to absorb photons with substantially similar energies.

8. The IC device of claim 1, wherein all of the plurality of IC stages are configured to be current matched.

9. The IC device of claim 1, wherein the absorption region comprises one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

10. The IC device of claim 1, wherein the intraband transport region comprises one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

11. The IC device of claim 1, wherein the interband tunneling region comprises one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

12. The IC device of claim 1, wherein the plurality of IC stages is grown on a substrate selected from the group consisting of InAs, InP, GaAs, GaSb, ZnS, SiC, ZnO, Si, Ge, and sapphire.

13. The IC device of claim 1, wherein at least one of the IC stages of the plurality of IC stages is combined with one or more conventional p-n junctions with interband cascade stages.

14. The IC device of claim 1, wherein the absorption regions in the plurality of IC stages have thicknesses that are shorter than a carrier diffusion length.

15. An interband cascade (IC) device, comprising:
a plurality of IC stages, wherein at least one of the IC stages comprises:
a conduction band and a valence band;
an absorption region comprising a Type-I superlattice with a first band gap, the absorption region configured to absorb photons;
an intraband transport region coupled to the absorption region and comprising a first heterostructure and a second band gap that is greater than the first band gap, wherein the first heterostructure comprises a first quantum well of a first composition and is configured to:
have no barrier in the conduction band in order to allow electrons in the conduction band to flow from the absorption region to the intraband transport region; and
have a first barrier in the valence band in order to suppress holes in the valence band from flowing from the absorption region to the intraband transport region; and
an interband tunneling region coupled to the absorption region so that the absorption region is positioned between the intraband transport region and the interband tunneling region, wherein the interband tunneling region is coupled to an adjacent intraband transport region of an adjacent IC stage via a type II heterointerface, wherein the interband tunneling region comprises a second heterostructure and a third band gap that is greater than the first band gap, wherein the second heterostructure comprises a second quantum well of a second composition that is different from the first composition, and wherein the second heterostructure is configured to:
have a second barrier in the conduction band in order to suppress the electrons in the conduction band from flowing from the absorption region to the interband tunneling region; and
have no barrier in the valence band in order to allow the holes in the valence band to flow from the absorption region to the interband tunneling region,
wherein the plurality of IC stages is configured so that the electrons flow from the conduction band of the absorption region to the intraband transport region then flow into an adjacent valence band of the adjacent IC stage.

16. An interband cascade (IC) device, comprising:
a plurality of IC stages, wherein at least one of the IC stages comprises:
a conduction band and a valence band;
an absorption region comprising a direct band gap semiconductor bulk material with a first band gap, the absorption region configured to absorb photons;
an intraband transport region coupled to the absorption region and comprising a first heterostructure and a second band gap that is greater than the first band gap, wherein the first heterostructure comprises a first quantum well of a first composition and is configured to:
have no barrier in the conduction band in order to allow electrons in the conduction band to flow from the absorption region to the intraband transport region; and
have a first barrier in the valence band in order to suppress holes in the valence band from flowing from the absorption region to the intraband transport region; and
an interband tunneling region coupled to the absorption region so that the absorption region is positioned between the intraband transport region and the interband tunneling region, wherein the interband tunneling region is coupled to an adjacent intraband transport region of an adjacent IC stage via a type II heterointerface, wherein the interband tunneling region comprises a second heterostructure and a third band gap that is greater than the first band gap, wherein the second heterostructure comprises a second quantum well of a second composition that is different from the first composition, and wherein the second heterostructure is configured to:
have a second barrier in the conduction band in order to suppress the electrons in the conduction band from flowing from the absorption region to the interband tunneling region; and
have no barrier in the valence band in order to allow the holes in the valence band to flow from the absorption region to the interband tunneling region; and
wherein the plurality of IC stages is configured so that the electrons flow from the conduction band of the absorption region to the intraband transport region then flow into an adjacent valence band of the adjacent IC stage.

17. The IC device of claim 16, wherein the IC device is a photovoltaic (PV) device configured to operate at a forward bias voltage with net photon absorption for generating an electric power output.

18. The IC device of claim 16, wherein at least one of the absorption region, the intraband transport region, and the interband tunneling region comprises one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

19. The IC device of claim 1, wherein the intraband transport region is configured such that the conduction band at a first end of the intraband transport region is near the conduction band at the absorption region and the conduction band at a second end of the intraband transport region is near the valence band at an adjacent interband tunneling region.

20. The IC device of claim 1, wherein the at least one of the IC stages further comprises a first interface between the absorption region and the intraband transport region and a second interface between the absorption region and the interband tunneling region, wherein at the first interface the valence band is higher in the absorption region than in the intraband transport region, and wherein at the second interface the conduction band is lower in the absorption region than in the interband tunneling region.

21. The IC device of claim 20, wherein the conduction band in the intraband transport region slopes down as the conduction band in the intraband transport region proceeds in a first direction away from the first interface.

22. The IC device of claim 21, wherein the valence band in the interband tunneling region slopes up as the valence band in the interband tunneling region proceeds in a second direction away from the second interface.

23. The IC device of claim 15, wherein the IC device is a photovoltaic (PV) device configured to operate at a forward bias voltage with net photon absorption for generating an electric power output.

24. The IC device of claim 15, wherein at least one of the absorption region, the intraband transport region, and the interband tunneling region comprises one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlInGaSbAs.

* * * * *